United States Patent
Nakagawa et al.

(10) Patent No.: US 12,021,161 B2
(45) Date of Patent: Jun. 25, 2024

(54) SOLAR CELL, MULTI-JUNCTION SOLAR CELL, SOLAR CELL MODULE, AND PHOTOVOLTAIC POWER GENERATION SYSTEM

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Naoyuki Nakagawa, Tokyo (JP); Yukitami Mizuno, Toyko (JP); Soichiro Shibasaki, Tokyo (JP); Yuya Honishi, Saitama Saitama (JP); Mutsuki Yamazaki, Yokohama Kanagawa (JP); Yoshiko Hiraoka, Kawasaki Kanagawa (JP); Kazushige Yamamoto, Yokohama Kanagawa (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 17 days.

(21) Appl. No.: 17/898,512

(22) Filed: Aug. 30, 2022

(65) Prior Publication Data
US 2023/0125003 A1 Apr. 20, 2023

Related U.S. Application Data

(63) Continuation of application No. PCT/JP2020/038404, filed on Oct. 9, 2020.

(51) Int. Cl.
*H01L 31/044* (2014.01)
*H01L 31/0224* (2006.01)
(Continued)

(52) U.S. Cl.
CPC .... *H01L 31/032* (2013.01); *H01L 31/022483* (2013.01); *H01L 31/0725* (2013.01)

(58) Field of Classification Search
CPC .................. H01L 31/00–078; Y02E 10/50–60
(Continued)

(56) References Cited

U.S. PATENT DOCUMENTS

2009/0151781 A1* 6/2009 Lee .................. H01L 31/03529
427/255.6
2012/0160298 A1* 6/2012 Kanamoto ............ H01L 31/076
438/98

(Continued)

FOREIGN PATENT DOCUMENTS

| JP | 08-130321 | 5/1996 |
|---|---|---|
| JP | 2004-214300 | 7/2004 |

(Continued)

OTHER PUBLICATIONS

Shibasaki et al., Transparent Cu2O solar cell for high-efficiency and low cost tandem photovoltaics, 2019 IEEE 46th Photovoltaic Specialists Conference (Year: 2019).*

(Continued)

*Primary Examiner* — Bach T Dinh
(74) *Attorney, Agent, or Firm* — Amin, Turocy & Watson, LLP

(57) ABSTRACT

A solar cell of an embodiment includes a p-electrode; an n-electrode; a p-type light-absorbing layer located between the p-electrode and the n-electrode and mainly containing a cuprous oxide; and an n-type layer located between the first n-type layer and the n-electrode, the n-type layer including a first n-type layer and a second n-type layer or a first n-type region and a second n-type region; wherein the first n-type layer and the first n-type region is located on the p-type light-absorbing layer side, the second n-type layer and the (Continued)

second n-type region is located on the n-electrode side, the first n-type layer and the first n-type region mainly contain a compound represented by $Ga_{x1}M1_{x2}O_{x3}$, the M1 is one or more selected from the group consisting of Hf, Zr, In, Zn, Ti, Al, B, Sn, Si, and Ge, the x1, the x2, and the x3 are more than 0, and the x3 when a sum of the x1 and the x2 is 2 is 3.0 or more and 3.8 or less, the second n-type layer and the second n-type region mainly contain a compound represented by $Ga_{y1}Zn_{y2}M2_{y3}M3_{y4}O_{y5}$, the M2 is one or more selected from the group consisting of Hf, Zr, In, Ti, Al, B, Si, and Ge, the M3 is Sn or/and Mg, the y1, the y2, the y3, and the y4 are 0 or more, a sum of the y3 and the y4 is more than 0, and the y5 when a sum of the y1, the y2, the y3, and the y4 is 2 is 2.2 or more and 3.6 or less.

20 Claims, 8 Drawing Sheets

(51) Int. Cl.
*H01L 31/032* (2006.01)
*H01L 31/0725* (2012.01)

(58) Field of Classification Search
USPC .................................................. 136/243–265
See application file for complete search history.

(56) References Cited

U.S. PATENT DOCUMENTS

| | | |
|---|---|---|
| 2012/0285523 A1 | 11/2012 | Negami et al. |
| 2013/0146142 A1 | 6/2013 | Shibasaki et al. |
| 2020/0194608 A1 | 6/2020 | Yamamoto et al. |

FOREIGN PATENT DOCUMENTS

| | | |
|---|---|---|
| JP | 2005-123272 | 5/2005 |
| JP | 2013-106012 | 5/2013 |
| JP | 2015-162650 | 9/2015 |
| JP | 6276610 | 2/2018 |
| JP | 2018-046196 | 3/2018 |
| WO | 2011/090134 | 7/2011 |
| WO | 2020/059053 | 3/2020 |

OTHER PUBLICATIONS

Minami et al., Cu2O-based solar cells using oxide semiconductors, Journal of Semiconductors, 2016, vol. 37, No. 1 (Year: 2016).*
International Search Report for International Application No. PCT/JP2020/038404 mailed on Dec. 22, 2020, 13 pgs.
Minami, et al., "Heterojunction solar cell with 6% efficiency based on an n-type aluminum-gallium-oxide thin film and p-type sodium-doped Cu2O sheet" Applied Physics Express 8, 022301 (2015).
Minami, et al., "Relationship between the electrical properties of the n-oxide and p-Cu2O layers and the photovoltaic properties of Cu2O-based heterojunction solar cells", Solar Energy Materials & Solar Cells, 2016 vol. 147, pp. 85-93.
Minami, et al., "Cu2O-based heterojunction solar cells with an Al-doped ZnO/oxide semiconductor/thermally oxidized Cu2O sheet structure", Solar Energy, 2014, vol. 105, pp. 206-217.

* cited by examiner

| | First n-type Layer (First Region) | | Second n-type Layer (Second Region) | |
|---|---|---|---|---|
| | Composition | Gradient | Composition | Gradient |
| Example 1 | $Ga_{1.40}Al_{0.60}O_{3.00}$ | no | $Ga_{0.30}Zn_{1.30}Al_{0.10}Sn_{0.30}O_{2.50}$ | no |
| Example 2 | $Ga_{1.40}Hf_{0.60}O_{3.30}$ | no | $Ga_{0.30}Zn_{1.30}Hf_{0.10}Sn_{0.30}O_{2.50}$ | no |
| Example 3 | $Ga_{1.40}Zr_{0.60}O_{3.30}$ | no | $Ga_{0.30}Zn_{1.30}Zr_{0.10}Sn_{0.30}O_{2.55}$ | no |
| Example 4 | $Ga_{1.40}B_{0.60}O_{3.00}$ | no | $Ga_{0.30}Zn_{1.10}B_{0.10}Sn_{0.50}O_{2.50}$ | no |
| Example 5 | $Ga_{1.20}Al_{0.70}Ti_{0.05}Sn_{0.05}O_{3.05}$ | no | $Ga_{0.10}Zn_{1.49}Al_{0.10}Ti_{0.01}Sn_{0.30}O_{2.41}$ | no |
| Example 6 | $Ga_{1.20}Al_{0.70}Ti_{0.05}Si_{0.05}O_{3.05}$ | no | $Ga_{0.10}Zn_{1.49}Al_{0.10}Ti_{0.01}Sn_{0.30}O_{2.41}$ | no |
| Example 7 | $Ga_{1.20}Al_{0.70}Ti_{0.05}Ge_{0.05}O_{3.05}$ | no | $Ga_{0.10}Zn_{1.49}Al_{0.10}Ti_{0.01}Sn_{0.30}O_{2.41}$ | no |
| Example 8 | $Ga_{1.40}Al_{0.60}O_{3.00}$ | no | $Ga_{0.10}Zn_{1.25}Al_{0.10}In_{0.05}Sn_{0.50}O_{2.63}$ | no |
| Example 9 | $Ga_{1.40}Al_{0.60}O_{3.00}$ | no | $Ga_{0.10}Zn_{1.25}Al_{0.10}B_{0.05}Sn_{0.50}O_{2.63}$ | no |
| Example 10 | $Ga_{1.40}Al_{0.60}O_{3.00}$ | no | $Ga_{0.15}Zn_{1.25}Al_{0.10}Sn_{0.50}O_{2.63}$ | no |
| Example 11 | $Ga_{1.40}Al_{0.60}O_{3.00}$ | no | $Ga_{0.10}Zn_{1.25}Al_{0.10}In_{0.05}Sn_{0.50}O_{2.63}$ | no |
| Example 12 | $Ga_{1.40}Al_{0.60}O_{3.00}$ | no | $Ga_{0.10}Zn_{1.25}Al_{0.10}In_{0.04}Ti_{0.01}Sn_{0.50}O_{2.5}$ | no |
| Example 13 | $Ga_{1.40}Al_{0.60}O_{3.00}$ | no | $Ga_{0.11}Zn_{1.25}Al_{0.10}In_{0.04}Sn_{0.50}O_{2.63}$ | no |
| Example 14 | $Ga_{1.40}Al_{0.60}O_{3.00}$ | no | $Ga_{0.10}Zn_{1.25}Al_{0.10}In_{0.05}Sn_{0.50}O_{2.63}$ | no |
| Example 15 | $Ga_{1.40}Al_{0.60}O_{3.00}$ | no | $Ga_{0.10}Zn_{1.30}Al_{0.15}Sn_{0.40}Mg_{0.10}O_{2.65}$ | no |
| Example 16 | $Ga_{1.40}Al_{0.60}O_{3.00}$ | no | $Ga_{0.10}Zn_{1.30}Al_{0.10}Sn_{0.50}O_{2.70}$ | no |
| Example 17 | $Ga_{1.40}Al_{0.60}O_{3.00}$ | no | $Ga_{0.10}Zn_{1.30}Al_{0.10}Sn_{0.50}O_{2.70}$ | no |
| Example 18 | $Ga_{1.40}Al_{0.60}O_{3.00}$ | no | $Ga_{0.10}Zn_{1.30}Al_{0.10}Sn_{0.50}O_{2.70}$ | no |
| Example 19 | $Ga_{1.40}Al_{0.60}O_{3.00}$ | yes | $Ga_{0.10}Zn_{1.30}Al_{0.10}Sn_{0.50}O_{2.70}$ | no |
| Example 20 | $Ga_{1.40}Al_{0.60}O_{3.00}$ | yes | $Ga_{0.10}Zn_{1.30}Al_{0.10}Sn_{0.50}O_{2.70}$ | yes |
| Example 21 | $Ga_{1.40}Al_{0.60}O_{3.00}$ | yes | $Ga_{0.10}Zn_{1.30}Al_{0.10}Sn_{0.50}O_{2.70}$ | yes |
| Example 22 | $Ga_{1.40}Al_{0.60}O_{3.00}$ | yes | $Ga_{0.10}Zn_{1.30}Al_{0.10}Sn_{0.50}O_{2.70}$ | yes |
| Comparative Example 1 | $Ga_{1.40}Al_{0.60}O_{3.00}$ | no | $Ga_2O_3$ | no |
| Comparative Example 2 | $Ga_{1.40}Al_{0.60}O_{3.00}$ | yes | $Ga_2O_3$ | no |
| Comparative Example 3 | $Ga_{1.40}Al_{0.60}O_{3.00}$ | no | $Ga_2O_3$ | no |
| Comparative Example 4 | $Ga_{1.40}Hf_{0.60}O_{3.30}$ | no | $Ga_2O_3$ | no |
| Comparative Example 5 | $Ga_{1.40}Zr_{0.60}O_{3.30}$ | no | $Ga_2O_3$ | no |
| Comparative Example 6 | $Ga_{1.40}B_{0.60}O_{3.00}$ | no | $Ga_2O_3$ | no |
| Comparative Example 7 | $Ga_{1.40}Al_{0.60}O_{3.00}$ | no | - | - |

Fig.10A

|  | Third n-type Layer (Third Region) | | n-electrode |
|---|---|---|---|
|  | Composition | Gradient |  |
| Example 1 | - | - | Al-doped ZnO |
| Example 2 | - | - | Al-doped ZnO |
| Example 3 | - | - | Al-doped ZnO |
| Example 4 | - | - | Al-doped ZnO |
| Example 5 | - | - | Al-doped ZnO |
| Example 6 | - | - | Al-doped ZnO |
| Example 7 | - | - | Al-doped ZnO |
| Example 8 | - | - | ITO |
| Example 9 | - | - | B-doped ZnO |
| Example 10 | - | - | Ga-doped ZnO |
| Example 11 | - | - | In-doped ZnO |
| Example 12 | - | - | Ti-doped $In_2O_3$ |
| Example 13 | - | - | IGZO |
| Example 14 | - | - | H-doped $In_2O_3$ |
| Example 15 | - | - | Al-doped ZnO |
| Example 16 | $Ga_2O_3$ | no | Al-doped ZnO |
| Example 17 | $Ga_{1.80}Al_{0.20}O_{3.00}$ | no | Al-doped ZnO |
| Example 18 | $Ga_{1.60}Al_{0.40}O_{3.00}$ | no | Al-doped ZnO |
| Example 19 | - | - | Al-doped ZnO |
| Example 20 | $Ga_2O_3$ | no | Al-doped ZnO |
| Example 21 | $Ga_{1.80}Al_{0.20}O_{3.00}$ | yes | Al-doped ZnO |
| Example 22 | $Ga_{1.60}Al_{0.40}O_{3.00}$ | yes | Al-doped ZnO |
| Comparative Example 1 | - | - | Al-doped ZnO |
| Comparative Example 2 | - | - | Al-doped ZnO |
| Comparative Example 3 | - | - | Al-doped ZnO |
| Comparative Example 4 | - | - | Al-doped ZnO |
| Comparative Example 5 | - | - | Al-doped ZnO |
| Comparative Example 6 | - | - | Al-doped ZnO |
| Comparative Example 7 | - | - | Al-doped ZnO |

Fig.10B

|  | Transmittance | Jsc | VoC | FF | Conversion Efficiency |
|---|---|---|---|---|---|
| Example 1 | B | A | A | B | A |
| Example 2 | B | A | A | B | A |
| Example 3 | B | A | A | B | A |
| Example 4 | B | A | A | B | A |
| Example 5 | A | A | B | B | B |
| Example 6 | A | A | B | B | B |
| Example 7 | A | A | B | B | B |
| Example 8 | B | A | A | B | A |
| Example 9 | B | A | A | B | A |
| Example 10 | B | A | A | B | A |
| Example 11 | B | A | A | B | A |
| Example 12 | B | A | A | B | A |
| Example 13 | B | A | A | B | A |
| Example 14 | B | A | A | B | A |
| Example 15 | B | A | A | A | A |
| Example 16 | B | A | A | A | A |
| Example 17 | B | A | A | A | A |
| Example 18 | B | A | A | A | A |
| Example 19 | B | A | A | A | A |
| Example 20 | B | A | A | A | A |
| Example 21 | B | A | A | A | A |
| Example 22 | B | A | A | A | A |
| Comparative Example 1 | B | - | - | - | - |
| Comparative Example 2 | B | B | B | C | C |
| Comparative Example 3 | B | B | B | C | C |
| Comparative Example 4 | B | B | B | C | C |
| Comparative Example 5 | B | B | B | C | C |
| Comparative Example 6 | B | B | B | C | C |
| Comparative Example 7 | B | C | C | C | C |

Fig.11

SOLAR CELL, MULTI-JUNCTION SOLAR CELL, SOLAR CELL MODULE, AND PHOTOVOLTAIC POWER GENERATION SYSTEM

CROSS-REFERENCE TO RELATED APPLICATION

This application is a Continuation application based upon and claims the benefit of priority from International Patent Application No. PCT/JP2020/38404, the International Filing Date of which is Oct. 9, 2020, the entire contents of which are incorporated herein by reference.

FIELD

Embodiments described herein relate generally to a solar cell, a multi-junction solar cell, a solar cell module, and a photovoltaic power generation system.

BACKGROUND

One of new solar cells is a solar cell using a cuprous oxide ($Cu_2O$) for a light-absorbing layer. $Cu_2O$ is a wide-gap semiconductor. Since $Cu_2O$ is a safe and inexpensive material including copper and oxygen abundantly present on the earth, it is expected that a high-efficiency and low-cost solar cell can be realized.

BRIEF DESCRIPTION OF THE DRAWINGS

FIG. 10A and FIG. 10B are tables related to Examples.
FIG. 11 is a table related to Examples.

DETAILED DESCRIPTION

A solar cell of an embodiment includes a p-electrode, an n-electrode, a p-type light-absorbing layer located between the p-electrode and the n-electrode and mainly containing a cuprous oxide, and an n-type layer located between the first n-type layer and the n-electrode, the n-type layer including a first n-type layer and a second n-type layer or a first n-type region and a second n-type region. The first n-type layer and the first n-type region are located on the p-type light-absorbing layer side. The second n-type layer and the second n-type region are located on the n-electrode side. The first n-type layer and the first n-type region mainly contain a compound represented by $Ga_{x1}M1_{x2}O_{x3}$. The M1 is one or more selected from the group consisting of Hf, Zr, In, Zn, Ti, Al, B, Sn, Si, and Ge. The x1, the x2, and the x3 are more than 0. The x3 when a sum of the x1 and the x2 is 2 is 3.0 or more and 3.8 or less. The second n-type layer and the second n-type region mainly contain a compound represented by $Ga_{y1}Zn_{y2}M2_{y3}M3_{y4}O_{y5}$. The M2 is one or more selected from the group consisting of Hf, Zr, In, Ti, Al, B, Si, and Ge. The M3 is Sn or/and Mg, the y1, the y2, the y3, and the y4 are 0 or more. A sum of the y3 and the y4 is more than 0. The y5 when a sum of the y1, the y2, the y3, and the y4 is 2 is 2.2 or more and 3.6 or less.

Hereinafter, an embodiment will be described in detail with reference to the drawings. Unless otherwise specified, values at 25° C. and 1 atm (atmosphere) are shown.

First Embodiment

Figure 1:
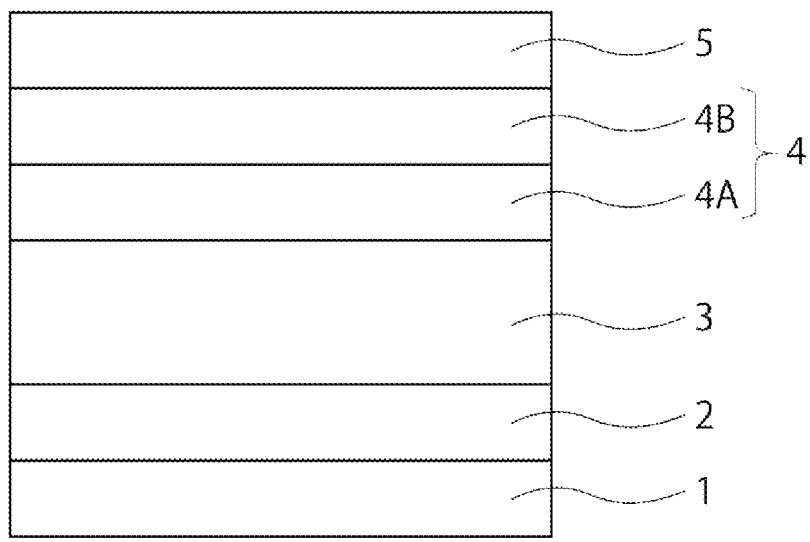
FIG. 1 is a cross-sectional view of a solar cell according to an embodiment.

A first embodiment relates to a solar cell. FIG. 1 illustrates a cross-sectional view of a solar cell 100 of the first embodiment. As illustrated in FIG. 1, the solar cell 100 according to the present embodiment includes a substrate 1, a p-electrode 2 as a first electrode, a p-type light-absorbing layer 3, a n-type layer 4 including a first n-type layer 4A and a second n-type layer 4B, and an n-electrode 5 as a second electrode. An intermediate layer which is not illustrated may be included between the second n-type layer 4B and the n-electrode 5. Sunlight may be incident from either the n-electrode 5 side or the p-electrode 2 side, but is more preferably incident from the n-electrode 5 side. Since the solar cell 100 of the embodiment is a transmissive solar cell, it is preferable that the solar cell is used as a top cell (light incident side) of a multi-junction solar cell. In FIG. 1, the substrate 1 is provided on a side of the p-electrode 2 opposite to the p-type light-absorbing layer 3 side, but the substrate 1 may be provided on a side of the n-electrode 5 opposite to the second n-type layer 4B side. Hereinafter, although a configuration illustrated in FIG. 1 will be described, a configuration in which the substrate 1 is provided on the n-electrode 5 side except that a position of the substrate 1 is different is also used. In the solar cell 100 of the embodiment, light is incident from the n-electrode 5 side toward the p-electrode 2 side.

The substrate 1 is a transparent substrate. A transparent organic substrates such as acrylic, polyimide, polycarbonate, polyethylene terephthalate (PET), polypropylene (PP), fluorine-based resins (polytetrafluoroethylene (PTFE), perfluoroethylene propene copolymer (FEP), ethylene tetrafluoroethylene copolymer (ETFE), polychlorotrifluoroethylene (PCTFE), perfluoroalkoxy alkane (PFA), and the like), polyarylate, polysulfone, polyethersulfone, and polyetherimide and inorganic substrates such as soda lime glass, white glass, chemically strengthened glass, and quartz can be used as the substrate 1. As the substrate 1, the substrates listed above can be laminated.

The p-electrode 2 is provided on the substrate 1 and is disposed between the substrate 1 and the p-type light-absorbing layer 3. The p-electrode 2 is a conductive layer having transparency provided on the p-type light-absorbing layer 3 side. A thickness of the p-electrode 2 is typically 100 nm or more and 2,000 nm or less. In FIG. 1, the p-electrode 2 is in direct contact with the light-absorbing layer 3. It is preferable that the p-electrode 2 includes one or more layers of transparent conductive oxide films. The transparent conductive oxide film is not particularly limited, and is an indium tin oxide (ITO), an Al-doped zinc oxide (AZO), a boron-doped zinc oxide (BZO), a gallium-doped zinc Oxide (GZO), a doped tin oxide, a titanium-doped indium oxide (ITiO), an indium zinc oxide (IZO), an indium gallium zinc oxide (IGZO), a hydrogen-doped indium oxide (IOH), or the like. The transparent conductive oxide film may be a stacked film having a plurality of films. A dopant for a film of tin oxide or the like is not particularly limited as long as the dopant is one or more selected from the group consisting of In, Si, Ge, Ti, Cu, Sb, Nb, Ta, W, Mo, F, Cl, and the like. It is preferable that the p-electrode 2 preferably includes a tin oxide film doped with one or more elements selected from the group consisting of In, Si, Ge, Ti, Cu, Sb, Nb, Ta, W, Mo, F, Cl, and the like. In the doped tin oxide film, one or more elements selected from the group consisting of In, Si, Ge, Ti, Cu, Sb, Nb, Ta, W, Mo, F, Cl, and the like are preferably contained at 10 atom % or less with respect to tin contained in the tin oxide film. As the p-electrode 2, a stacked film in which a transparent conductive oxide film and a metal film are stacked can be used. The metal film preferably has a thickness of 10 nm or less. The metal (including alloy) contained in the metal film is not particularly limited to Mo, Au, Cu, Ag, Al, Ta, W, or the like. It is preferable that the p-electrode 2 includes a dot-shaped, line-shaped, or mesh-shaped electrode (one or more selected from the group consisting of metal, an alloy, graphene, a conductive nitride, and a conductive oxide) between the transparent conductive oxide film and the substrate 1 or between the transparent conductive oxide film and the p-type light-absorbing layer 3. It is preferable that the dot-shaped, line-shaped, or mesh-shaped metal has an aperture ratio of 50% or more with respect to the transparent conductive film. The dot-like, line-like, or mesh-like metal is not particularly limited, and is Mo, Au, Cu, Ag, Al, Ta, W, or the like. When the metal film is used for the p-electrode, it is preferable that a film thickness is about 5 nm or less from the viewpoint of transparency. When the line-shaped or mesh-shaped metal film is used, since the transparency is secured at an opening, the film thickness of the metal film is not limited thereto.

The p-type light-absorbing layer 3 is a p-type semiconductor layer. The p-type light-absorbing layer 3 may be in direct contact with the p-electrode 2, or other layers may be present as long as the contact with the p-electrode 2 can be secured. The p-type light-absorbing layer 3 is disposed between the p-electrode 2 and the first n-type layer 4A. The p-type light-absorbing layer 3 forms a p-n junction with the first n-type layer 4A. The p-type light-absorbing layer 3 is a semiconductor layer of a metal oxide containing Cu as a main component. The metal oxide containing Cu as the main component is a cuprous oxide or/and a complex oxide of cuprous oxides. 90 wt % or more of the p-type light-absorbing layer 3 is preferably a cuprous oxide or/and the complex oxide of cuprous oxides. 95 wt % or more of the p-type light-absorbing layer 3 is more preferably a cuprous oxide or/and a complex oxide of cuprous oxides. 98 wt % or more of the p-type light-absorbing layer 3 is still more preferably a cuprous oxide or/and a complex oxide of cuprous oxides. It is preferable that the p-type light-absorbing layer 3 hardly contains Cu or/and CuO which is a heterogeneous phase. Since the p-type light-absorbing layer 3 contains less heterogeneous phases and has good crystallinity, it is preferable that the transmittance of the p-type light-absorbing layer 3 is increased. In the metal oxide containing Cu as the main component, Cu is 60.0 atom % or more and 67.0 atom % or less, and oxygen (O) is 32.5 atom % or more and 34.0 atom % or less. The complex oxide of cuprous oxides contains metal other than Cu. The metal contained in the complex oxide of cuprous oxides is one or more metals selected from the group consisting of Sn, Sb, Ag, Li, Na, K, Cs, Rb, Al, Ga, In, Zn, Mg, and Ca in addition to Cu. When one or more metals selected from the group consisting of Ag, Li, Na, K, Cs, Rb, Al, Ga, In, Zn, Mg, and Ca are contained in addition to Cu, a band gap of the p-type light-absorbing layer 3 can be adjusted. The band gap of the p-type light-absorbing layer 3 is preferably 2.0 eV or more and 2.2 eV or less. When the band gap is in such a range, sunlight can be efficiently used in both a top cell and a bottom cell in the multi-junction solar cell in which the solar cell using Si for the light-absorbing layer is used as the bottom cell and the solar cell of the embodiment is used as the top cell. The p-type light-absorbing layer 3 may further contain Sn or Sb. Sn or Sb in the p-type light-absorbing layer 3 may be added to the light-absorbing layer 3 or may be derived from the p-electrode 2. The p-type light-absorbing layer 3 is a layer of an oxide represented by $Cu_aM_bO_c$. M is one or more metals selected from the group consisting of Sn, Sb, Ag, Li, Na, K, Cs, Rb, Al, Ga, In, Zn, Mg, and Ca. a, b, and c preferably satisfy $1.80 \leq a \leq 2.01$, $0.00 \leq b \leq 0.20$, and $0.98 \leq c \leq 1.02$. A composition ratio of the p-type light-absorbing layer 3 is a composition ratio of the entire p-type light-absorbing layer 3. It is preferable that a compound composition ratio of the p-type light-absorbing layer 3 is entirely satisfied in the p-type light-absorbing layer 3. When concentrations of Sn and Sb in the p-type light-absorbing layer 3 are high, defects increase, and carrier recombination increases. Thus, a total volume concentration of Sb and Sn in the p-type light-absorbing layer 3 is preferably $1.5 \times 10^{19}$ atoms/cm$^3$ or less. Compositions of the p-type light-absorbing layer 3 and the n-type layer 4 are obtained by secondary ion mass spectrometry (SIMS). As an analysis position, an average value of values obtained in the same manner as the p-electrode 2 can be used as each layer composition.

A thickness of the p-type light-absorbing layer 3 is obtained by cross-sectional observation with an electron microscope or a step profiler, and is preferably 1,000 nm or more and 10,000 nm or less.

The p-type light-absorbing layer 3 is preferably formed by, for example, sputtering.

The first n-type layer 4A is an n-type semiconductor layer. The first n-type layer 4A is located between the p-type light-absorbing layer 3 and the second n-type layer 4B. The first n-type layer 4A is in direct contact with a surface of the p-type light-absorbing layer 3 opposite to a surface in contact with the p-electrode 2. It is preferable that the first n-type layer 4A is an oxide semiconductor layer containing Ga and contains a compound having Ga as a base. The first n-type layer 4A is an oxide semiconductor layer containing Ga and preferably contains a compound having Ga as a base. In the first n-type layer 4A, an oxide having Ga as a base may be mixed with another oxide, an oxide having Ga as a base may be doped with another element, or an oxide having Ga as a base and doped with another element may be mixed with another oxide.

It is preferable that the first n-type layer 4A is a layer that mainly contains (50 wt % or more of) a compound represented by $Ga_{x1}M1_{x2}O_{x3}$, the M1 is one or more selected from the group consisting of Hf, Zr, In, Zn, Ti, Al, B, Sn, Si, and Ge. The x1, the x2 and the x3 are more than 0.00. When the sum of the x1 and the x2 is 2, it is preferable that the x6 is 3.0 or more and 3.8 or less. All configurations of an oxide having Ga or/and Zn as a base is mixed with another oxide, an oxide having Ga or/and Zn as a base is doped with another element, and an oxide having Ga or/and Zn doped with another element as a base is mixed with another oxide are represented by $Ga_{x1}M1_{x2}O_{x3}$.

90 wt % or more of the first n-type layer 4A is preferably a compound represented by $Ga_{x1}M1_{x2}O_{x3}$. 95 wt % or more of the first n-type layer 4A is more preferably a compound represented by $Ga_{x1}M1_{x2}M2_{x3}M3_{x4}M4_{x5}O_{x6}$. 98 wt % or more of the first n-type layer 4A is still more preferably a compound represented by $Ga_{x1}M1_{x2}O_{x3}$. The first n-type layer 4A more preferably consists of a compound represented by $Ga_{x1}M1_{x2}O_{x3}$.

Figure 2:
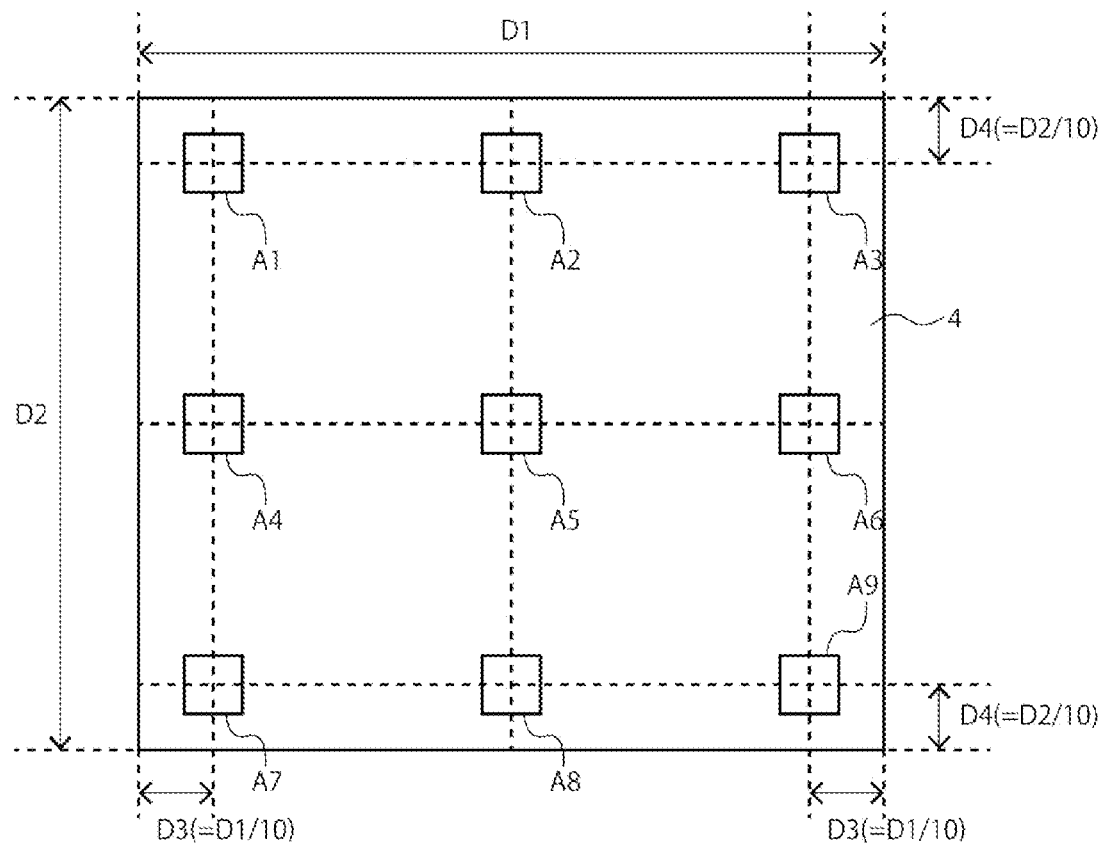
FIG. 2 is a diagram illustrating analysis spots of a solar cell according to an embodiment.

A composition of the compound of the first n-type layer 4A is an average composition of the entire first n-type layer 4A unless otherwise specified. When a thickness of the first n-type layer 4A is d, the composition of the first n-type layer 4A is an average value of the compositions at depths of 0.2d, 0.5d, and 0.8d from a surface of the first n-type layer 4A on the p-type light-absorbing layer 3 side. Unless there is a condition that an elemental composition ratio of the compound of the first n-type layer 4A is inclined, the first n-type layer 4A preferably satisfies the above compositions and the following suitable compositions at each depth. When the first n-type layer 4A is very thin (for example, 5 nm or less), the composition at a depth of 0.5d from the surface of the first n-type layer 4A on the p-type light-absorbing layer 3 side can be regarded as the composition of the entire first n-type layer 4A. In the analysis, analysis spots distributed as evenly as possible at equal intervals as represented in analysis spots of FIG. 2 at each distance from the surface of the n-type layer 4 are analyzed by, for example, secondary ion mass spectrometry (SIMS). FIG. 2 is a schematic diagram of the solar cell 100 as viewed from the light incident side. D1 is a length of the first n-type layer 4A in a width direction, and D2 is a length of the first n-type layer 4A in a depth direction.

The first n-type layer 4A which reduces the difference between the conduction band minimum (CBM) of the p-type light-absorbing layer 3 and the conduction band minimum of the first n-type layer 4A is preferable. The element of M1 is contained in the compound of the first n-type layer 4A in order to reduce the difference in the conduction band minimum because the conduction band minimum of $Ga_2O_3$ is very low compared with the p-type light-absorbing layer 3. The difference between the conduction band minimum of the p-type light-absorbing layer 3 and the conduction band minimum of the first n-type layer 4A ([conduction band minimum of p-type light-absorbing layer 3]–[conduction band minimum of first n-type layer 4A]) is preferably 0.0 eV or more and 0.4 eV or less.

The conduction band minimum of the first n-type layer 4A of the embodiment is adjusted mainly by kind of the element of M1 and the elements of Ga and M1. An element ratio of M1 is increased, and thus, the conduction band minimum of the first n-type layer 4A increases, and the difference in the conduction band minimum of the p-type light-absorbing layer 3 can be reduced. In view of reducing the difference in the conduction band minimum between the first n-type layer 4A and the p-type light-absorbing layer 3, the M1 preferably includes one or more selected from the group consisting of Al, B, Hf and Zr in the compound represented by $Ga_{x1}M1_{x2}O_{x3}$.

x2/(x1+x2) is preferably 0.10 or more and 0.60 or less. When x2/(x1+x2) is less than 0.10, it is difficult to obtain a solar cell having high conversion efficiency because a big cliff in which a conduction band at a p-n junction interface becomes discontinuous occurs and Voc is low. When x2/(x1+x2) is more than 0.60, it is difficult to obtain a solar cell having high conversion efficiency because a spike in which a conduction band at a p-n junction interface becomes discontinuous occurs, and FF decreases. According to the above viewpoint, X2/(x1+x2) is preferably 0.10 or more and 0.40 or less.

The element of M1 is one or more selected from the group consisting of Hf, Zr, In, Zn, Ti, Al, B, Sn, Si, and Ge. A more detailed description of $M1_{x2}$ is $Hf_{x20}Zr_{x21}In_{x22}Zn_{x23}Ti_{x24}Al_{x25}B_{x26}Sn_{x27}Si_{x28}Ge_{x29}$. Then, x2=x20+x21+x22+x23+x24+x25+x26+x27+x28+x29, and x20 to x29 are independently 0.00 or more and 0.60 or less, respectively. (X20+x21+x25+x26)/(x20+x21+x22+x23+x24+x25+x26+x27+x28+x29) is preferably 0.70 or more and 1.00 or less. Within this range, the difference in the conduction band minimum between the first n-type layer 4A and the p-type light-absorbing layer 3 can be easily reduced, and a solar cell having high conversion efficiency can be obtained. (X20+x21+x25+x26)/(x20+x21+x22+x23+x24+x25+x26+x27+x28+x29) is more preferably 0.80 or more and 1.00 or less, and even more preferably 0.90 or more and 1.00 or less.

The compound of the first n-type layer 4A can contain one or more selected from the group consisting of In, Ti and Zn of M1. In, Ti and Zn are elements that can increase the refractive index of the first n-type layer 4A. These elements are preferably used when the difference in refractive index between the first n-type layer 4A and the p-type light-absorbing layer 3 is large. Further, In, Ti and Zn can adjust the conduction band minimum of the first n-type layer 4A. The conduction band minimum of the first type layer 4A is mainly adjusted by the ratio of Ga, Hr, Zr, Al and B. If there are too much In, Ti and Zn, the difference in the conduction band minimum between the first n-type layer 4A and the p-type light-absorbing layer 3 may become large. Therefore, (x22+x23+x24)/(x20+x21+x22+x23+x24+x25+x26+x27+x28+x29) is preferably 0.00 or more and 0.20 or less, more preferably 0.00 or more and 0.10 or less, and more preferably 0.00 or more and 0.05 or less.

The compound of the first n-type layer 4A can contain one or more selected from the group consisting of Sn, Si and Ge of M1. Sn, Si and Ge are elements that can increase the carrier concentration of the first n-type layer 4A. If there are too much Sn, Si, and Ge, the difference in the conduction band minimum between the first n-type layer 4A and the p-type light-absorbing layer 3 may become large. Therefore, (x27+x28+x29)/(x20+x21+x22+x23+x24+x25+x26+x27+x28+x29) is preferably 0.00 or more and 0.20 or less, more preferably 0.00 or more and 0.10 or less, and more preferably 0.00 or more and 0.05 or less. In the first n-type layer 4A, the concentration of Sn is preferably low. Therefore, x27/(x20+x21+x22+x23+x24+x25+x26+x27+x28+x29) is preferably less than 0.05.

One or more elements selected from the group consisting of Ga and the element of M1 may have a composition ratio changing in the first n-type layer 4A in a film thickness direction of the first n-type layer 4A. It is preferable that one or more elements selected from the group consisting of In, Ti, Zn, Sn, Si, and Ge are small on the p-type light-absorbing layer 3 side and are large on the n-electrode 5 side. It is preferable that one or more element selected from the group consisting of Al, B, Hf, and Zr is large on the p-type light-absorbing layer 3 side and is small on the n-electrode 5 side. It is preferable that the change in the composition is an inclined change, a stepwise change, or a combination of the inclined change and the stepwise change. The change in the composition is entirely or partially in a stacking direction of the layers of the solar cell 100. The carrier concentration, the conduction band minimum, and the refractive index can be adjusted from the p-type light-absorbing layer 3 side toward the n-electrode 5 side by changing a composition distribution of these elements, and thus, it contributes to an improvement of the conversion efficiency.

The first n-type layer 4A is preferably formed by, for example, sputtering, atomic layer deposition (ALD), or the like.

The second n-type layer 4B is located between the first n-type layer 4A and the n-electrode 5. A surface of the second n-type layer 4B on the first n-type layer 4A side is in direct contact with the first n-type layer 4A. It is preferable that the second n-type layer 4B is an oxide semiconductor layer containing Ga or/and Zn and contains a compound having Ga or/and Zn as a base. An interface between the first n-type layer 4A and the second n-type layer 4B may be clear or unclear. In the second n-type layer 4B an oxide having Ga or/and Zn as a base may be mixed with another oxide, an oxide having Ga or/and Zn as a base may be doped with another element, or an oxide having Ga as a base and doped with another element may be mixed with another oxide. An intermediate layer which is not illustrated can be provided between the second n-type layer 4B and the n-electrode 5.

It is preferable that the second n-type layer 4B is a layer that mainly contains (50 wt % or more of) a compound represented by $Ga_{y1}Zn_{y2}M2_{y3}M3_{y4}O_{y5}$, the M2 is one or more selected from the group consisting of Hf, Zr, In, Ti, Al, B, Si, and Ge, and the M3 is Sn or/and Mg. the y1, the y2, the y3, and the y4 is 0 or more and, a sum of the y3 and y4 is more than 0. When a sum of the y1, the y2, the y3, and the y4 is 2, it is preferable that the y5 is 3.0 or more and 3.8 or less. All configurations of an oxide having Ga or/and Zn as a base is mixed with another oxide, an oxide having Ga or/and Zn as a base is doped with another element, and an oxide having Ga or/and Zn doped with another element as a base is mixed with another oxide are represented by $Ga_{y1}Zn_{y2}M2_{y3}M3_{y4}O_{y5}$.

90 wt % or more of the second n-type layer 4B is preferably a compound represented by $Ga_{y1}Zn_{y2}M2_{y3}M3_{y4}O_{y5}$. 95 wt % or more of the second n-type layer 4B is more preferably a compound represented by $Ga_{y1}Zn_{y2}M2_{y3}M3_{y4}O_{y5}$. 98 wt % or more of the second n-type layer 4B is still more preferably a compound represented by $Ga_{y1}Zn_{y2}M2_{y3}M3_{y4}O_{y5}$. The second n-type layer 4B more preferably consists of a compound represented by $Ga_{y1}Zn_{y2}M2_{y3}M3_{y4}O_{y5}$.

The second n-type layer 4B is adjusted by mainly by Ga, Zn, Sn, and Mg so as to decrease a difference in the conduction band minimum from the first n-type layer 4A and a difference in the conduction band minimum from the n-electrode 5. The conduction band minimum of MgO is larger than that of $Ga_2O_3$ and the conduction band minimum of $SnO_2$ is larger than that of ZnO. Thus, the conduction band minimum of ZnO can become larger by mixing MgO and/or $SnO_2$ in ZnO. Thereby, the conduction band minimum of the second n-type layer 4B is adjusted between that of $Ga_2O_3$ and the n-electrode 5. The conduction band minimum of the second n-type layer 4B becomes lower than that of the first n-type layer 4A by increasing the element ratio of Zn and Sn to be higher than the element ratio of Zn and Sn in the first n-type layer 4A. Then, the continuity of the connection of the conduction band minimum between the first n-type layer 4A and the n electrode 5 is improved.

Since the second n-type layer 4B is an oxide having Ga or Zn as a base, $(y1+y2)/(y1+y2+y3+y4)$ is preferably 0.60 or more and 0.98 or less. In the same viewpoint, $(y1+y2)/(y1+y2+y3+y4)$ is preferably 0.65 or more and 0.95 or less, and more preferably 0.70 or more and 0.95 or less. In the same viewpoint, $(y3+y4)/(y1+y2+y3+y4)$ is preferably 0.02 or more and 0.40 or less. In the same viewpoint, $(y3+y4)/(y1+y2+y3+y4)$ is preferably 0.05 or more and 0.35 or less.

The second n-type layer 4B is located closest to the n-electrode 5 side in the n-type layer 4, and preferably, the second n-type layer 4B is in direct contact with the n-electrode 5. When Zn or/and Sn is contained in the first n-type layer 4A, the composition ratio thereof is preferably lower than the concentrations of Zn and Sn in the second n-type layer 4B.

The element of M2 is preferably contained in the second n-type layer 4B. The element of M2 in the second n-type layer 4B is preferably included in the element contained in the first n-type layer 4A or/and the n-electrode 5. When the second n-type layer 4B contains Zn, the n-electrode 5 is a transparent conductive oxide film containing Zn. Since the element common to the second n-type layer 4B, the first n-type layer 4A, and the n-electrode 5 is contained, the second n-type layer 4B has good contact with both the first n-type layer 4A and the n-electrode 5.

The element represented by M2 is one or more selected from the group consisting of Hf, Zr, In, Ti, Al, B, Si, and Ge. It is preferable that the y3 which is the ratio of M2 contained in the second n-type layer 4B is smaller than the ratio x2 of the element of M1 contained in the first n-type layer 4B. A more detailed description of $M2_{y3}$ is $Hf_{y30}Zr_{y31}In_{y32}Ti_{y33}Al_{y34}B_{y35}Si_{y36}Ge_{y3}$, $y3=y30+y31+y32+y33+y34+y35+y36+y37$, and y30 to y37 are 0.00 or more and 0.40 or less, independently. $(y30+y31+y34+y35)/(y30+y31+y32+y33+y34+y35+y36+y37)$ is preferably 0.70 or more and 1.00 or less. Within this range, it is easy to reduce the difference in the conduction band minimum between the second n-type layer 4B and the first n-type layer 4A, and a solar cell having high conversion efficiency can be obtained. $(y30+y31+y34+y35)/(y30+y31+y32+y33+y34+y35+y36+y37)$ is more preferably 0.80 or more and 1.00 or less, and still more preferably 0.90 or more and 1.00 or less.

The second n-type layer 4B preferably contains Mg or Sn which are the element of M3. When Sn is contained in the second n-type layer 4B, the continuity of the connection of the conduction band minimum is preferably improved, and a carrier concentration is preferably increased. When Mg is contained in the second n-type layer 4B, the continuity of the connection of the conduction band minimum is preferably improved. Therefore, $y4/(y1+y2+y3+y4)$ is preferably 0.02 or more and 0.40 or less, and more preferably 0.05 or more and 0.35 or less.

One or more elements selected from the group consisting of Ga, Zn, the element of M2, and the element of M3 may have a composition ratio changing in the second n-type layer 4B in a film thickness direction of the second n-type layer 4B. It is preferable that one or more elements selected from the group consisting of In, Ti, Zn, Sn, Si, and Ge is small on the p-type light-absorbing layer 3 side and is large on the n-electrode 5 side. It is preferable that one or more elements selected from the group consisting of Al, B, Hf, and Zr are large on the p-type light-absorbing layer 3 side and are small on the n-electrode 5 side. It is preferable that the change in the composition is an inclined change, a stepwise change, or a combination of the inclined change and the stepwise change. The change in the composition is entirely or partially in a stacking direction of the layers of the solar cell 100. The carrier concentration, the conduction band minimum, and the refractive index can be adjusted from the p-type light-absorbing layer 3 side toward the n-electrode 5 side by changing a composition distribution of these elements, and thus, it contributes to an improvement of the conversion efficiency.

When a thickness of the second n-type layer 4B is $d_{4B}$, it is preferable that an element ratio of Ga in a region $d_{0-0.25}$ from a surface of the second n-type layer 4B on the first n-type layer 4A side to a depth of $0.25d_{4B}$ toward the n-electrode 5 is 1.10y1 (1.10 times of the y1 (the average of the second n-type layer 4B) (the same applies hereinafter)) or more and 2.50y1 (2.50 times of the y2 (the average of the second n-type layer 4B) (the same applies hereinafter)) or less. It is preferable that an element ratio of Ga in a region $d_{0.25\text{-}0.50}$ from the depth of $0.25d_{4B}$ from the surface of the second n-type layer 4B on the first n-type layer 4A side toward the n-electrode 5 to a depth of $0.50d_{4B}$ toward the n-electrode 5 is 0.75y1 or more and 1.50y1 or less. It is preferable that an element ratio of Ga in a region $d_{0.50\text{-}0.75}$ from the depth of $0.50d_{4B}$ from the surface of the second n-type layer 4B on the first n-type layer 4A side toward the n-electrode 5 to a depth of $0.75d_{4B}$ toward the n-electrode 5 is 0.30y1 or more and 1.5y1 or less. It is preferable that an element ratio of Ga in a region $d_{0.75\text{-}1}$ from the depth of $0.75d_{4B}$ from the surface of the second n-type layer 4B on the first n-type layer 4A side toward the n-electrode 5 to a depth of $1.00d_{4B}$ toward the n-electrode 5 is 0.00y1 or more and 0.75y1 or less. When the composition is changed, it is preferable that the composition ratio changing in the n-type layer 4 is in one direction in view of the continuity of the connection of the conduction band minimum. Specifically, it is preferable that the element ratio of Ga in the region $d_{0\text{-}0.25}$ is equal to the element ratio of Ga in the region $d_{0.25\text{-}0.50}$ or more. It is preferable that the element ratio of Ga in the region $d_{0.25\text{-}0.50}$ is more than the element ratio of Ga in the region $d_{0.50\text{-}0.75}$. It is preferable that the element ratio of Ga in the region $d_{0.50\text{-}0.75}$ is more than the element ratio of Ga in the region $d_{0.75\text{-}1}$. It is preferable that the composition the element ratio in M2 also changes like Ga.

Further, the Zn ratio in the region $d_{0\text{-}0.25}$ is preferably 0 or more and 0.75y2 or less, and the Zn ratio in the region $d_{0.25\text{-}0.50}$ is preferably 0.30y2 or more and 1.5y2 or less. The Zn ratio in the region $d_{0.50\text{-}0.75}$ is preferably 0.75y2 or more and 1.5y2 or less. The Zn ratio in the region $d_{0.75\text{-}1}$ is preferably 1.10y2 or more and 2.50y2 or less. When the composition is changed, it is preferable that the composition ratio changing in the n-type layer 4 is in one direction in view of the continuity of the connection of the conduction band minimum. Specifically, the Zn ratio in the region $d_{0\text{-}0.25}$ is preferably lower than the Zn ratio in the region $d_{0.25\text{-}0.50}$. The Zn ratio in the region $d_{0.25\text{-}0.50}$ is preferably lower than the Zn ratio in the region $d_{0.50\text{-}0.75}$. The Zn ratio in the region $d_{0.50\text{-}0.75}$ is preferably lower than the Zn ratio in the region $d_{0.75\text{-}1}$. It is preferable that the composition of the element of M3 also changes like Zn.

The second n-type layer 4B is preferably formed by, for example, sputtering, atomic layer deposition (ALD), or the like. Since the composition can be precisely controlled, ALD film formation is more preferable. Since the element is only diffused by only stacking the first n-type layer 4A and the second n-type layer 4B, it is difficult to arrange the target element at the intended position on the entire second n-type layer 4B.

The sum of a film thickness of the first n-type layer 4A and a film thickness of the second n-type layer 4B is typically 3 nm or more and 100 nm or less. When the sum of the film thickness of the first n-type layer 4A and the film thickness of the second n-type layer 4B is less than 3 nm, a leakage current may be generated in a case where coverage of the first n-type layer 4A and the second n-type layer 4B is poor, and characteristics may be deteriorated. When the coverage is good, the film thickness is not limited to the above film thickness. When the sum of the film thickness of the first n-type layer 4A and the film thickness of the second n-type layer 4B exceeds 50 nm, characteristics may be deteriorated due to an excessive increase in resistance of the n-type layer 4 from the first n-type layer 4A to the second n-type layer 4B, or a short-circuit current may be reduced due to a decrease in transmittance. Accordingly, the sum of the film thickness of the first n-type layer 4A and the film thickness of the second n-type layer 4B is more preferably 3 nm or more and 30 nm or less, still more preferably 5 nm or more and 30 nm or less.

The n-electrode 5 is an electrode on the n-type layer 4 side having transparency to visible light. The first n-type layer 4A and the second n-type layer 4B are sandwiched between the n-electrode 5 and the p-type light-absorbing layer 3. An intermediate layer which is not illustrated can be provided between the second n-type layer 4B and the n-electrode 5. The intermediate layer can include a mesh-shaped or line-shaped electrode. It is preferable that a transparent conductive oxide film is used for the n-electrode 5. It is preferable that the transparent conductive oxide film used for the n-electrode 5 is one or more transparent conductive films selected from the group consisting of an indium tin oxide, an aluminum-doped zinc oxide, a boron-doped zinc oxide, a gallium-doped zinc oxide, an indium-doped zinc oxide, a titanium-doped indium oxide, an indium gallium zinc oxide, and a hydrogen-doped indium oxide.

When the indium tin oxide is used for the n electrode 5, it is preferable that In or/and Sn are contained in the second n-type layer 4B. When the aluminum-doped zinc oxide is used for the n-electrode 5, it is preferable that the second n-type layer 4B contains Al or/and Zn. When the boron-doped zinc oxide is used for the n-electrode 5, it is preferable that the second n-type layer 4B contains B or/and Zn. When the gallium-doped zinc oxide is used for the n-electrode 5, it is preferable that Ga or/and Zn are contained in the second n-type layer 4B. When the indium-doped zinc oxide is used for the n-electrode 5, it is preferable that In or/and Zn are contained in the second n-type layer 4B. When the titanium-doped indium oxide is used for the n-electrode 5, it is preferable that the second n-type layer 4B contains Ti or/and In. When the indium gallium oxide zinc oxide is used for the n-electrode 5, it is preferable that the second n-type layer 4B contains at least one selected from the group consisting of In, Ga, and Zn. When the hydrogen-doped indium oxide is used for the n-electrode 5, it is preferable that In is contained in the second n-type layer 4B.

A thickness of the n-electrode 5 is obtained by cross-sectional observation with an electron microscope or a step gauge, and is not particularly limited, but is typically 1 nm or more and 2 µm or less.

It is preferable that the n-electrode 5 is formed by, for example, sputtering.

Second Embodiment

Figure 3:
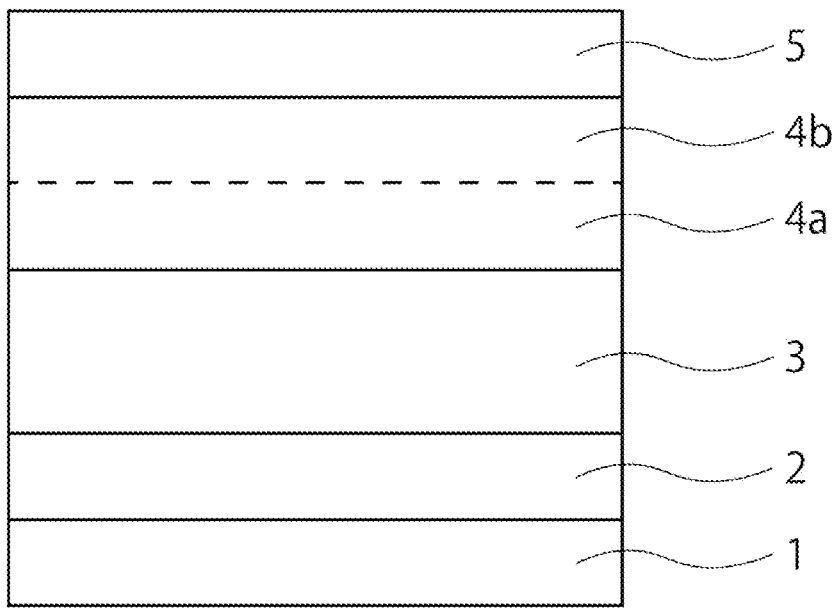
FIG. 3 is a cross-sectional view of a solar cell according to an embodiment.

A second embodiment relates to a solar cell. FIG. 3 is a schematic cross-sectional view of a solar cell 101 according to the second embodiment. The solar cell 101 of the second embodiment is different from the solar cell 100 of the first embodiment in that the n-type layer 4 has a first region 4a which corresponds to the first n-type layer 4A and a second region 4b which corresponds to the second n-type layer 4B. Description common to the first embodiment and the second embodiment will be omitted.

Although, the n-type layer 4 in the solar cell 101 of the second embodiment has no interface in the layer, a region on the p-type light-absorbing layer 3 side of the n-type layer 4 satisfies the requirements of the first n-type layer 4A of the first embodiment. This region is regarded as the first region 4a. Further, a region on the n-electrode 5 side of the n-type layer 4 satisfies the requirements of the second n-type layer 4B of the first embodiment. This region is regarded as the second region 4b. When the film thickness of the n-type layer 4 is d, it is possible to evaluate whether or not the n-type layer 4 includes the first region 4a and the second region 4b by analyzing the positions from the surface on the p-type light-absorbing layer side at a distance of 0.1d, a distance at 0.3d, at a distance of 0.5d, a distance at 0.7d, and at a distance of 0.9d. When the thickness of the n-type layer 4 is thin, for example, the thickness is about 10 nm, it is preferable that it is analyzed the positions from the surface in the p-type light-absorbing layer side at a distance of 0.25d, a distance of 0.50d, and a distance of 0.75d in the n-type layer 4.

In the n-type layer 4, when the composition changes entirely in the film thickness direction in the layer, it is difficult to define the boundary between the first region 4a and the second region 4b. In such a case, analysis is performed at the distance of 0.1d, the distance at 0.3d, at the distance of 0.5d, at the distance of 0.7d, and at the distance of 0.9d from the surface on the p-type light-absorbing layer 3 side, it can be defied that a position where $y4/(y1+y2+y3+y4)$ satisfies 0.10 or more is a boundary between the first region 4a and the second region 4b. The p-type light-absorbing layer 3 side of the boundary is the first region 4a, and the average composition of the first region 4a can be obtained. Further, the n-electrode 5 side of the above region is the second region 4b, and the average composition of the second region 4b can be obtained. When the thickness of the n-type layer 4 is thin, it is preferable to adopt the above position for the depth to be analyzed.

Also when the n-type layer 4 of the second embodiment is used, the continuity of the connection of the conduction band minimum from the p-type light-absorbing layer 3 to the n-electrode 5 is improved, and the Voc, Jsc, FF and conversion efficiency are improved.

Third Embodiment

Figure 4:
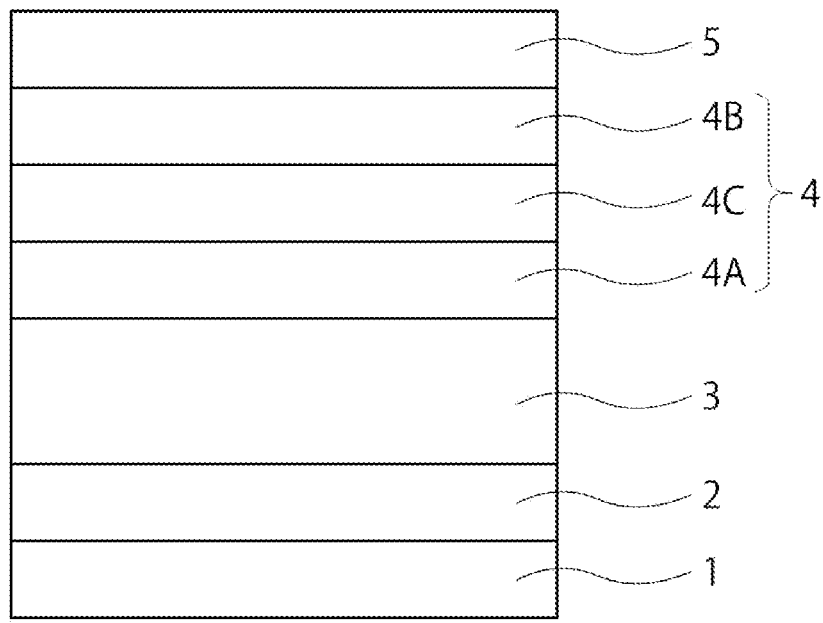
FIG. 4 is a cross-sectional view of a solar cell according to an embodiment.

A third embodiment relates to a solar cell. FIG. 4 is a schematic cross-sectional view of a solar cell 102 according to the third embodiment. The solar cell 102 of the third embodiment is different from the solar cell 101 of the second embodiment has an n-type layer 4 including a third n-type layer 4C between the first n-type layer 4A the second n-type layer 4B, and so forth. Descriptions common to the first embodiment and the second embodiment will be omitted.

The third n-type layer 4C is located between the first n-type layer 4A and the second n-type layer 4B. A surface of the third n-type layer 4C on the first n-type layer 4A side is in direct contact with the first n-type layer 4A. It is preferable that the third n-type layer 4C is an oxide semiconductor layer containing Ga and contains a compound having Ga as a base. An interface between the first n-type layer 4A and the third n-type layer 4C may be clear or unclear. In the third n-type layer 4C, an oxide having Ga as a base may be mixed with another oxide, an oxide having Ga as a base may be doped with another element, or an oxide having Ga as a base and doped with another element may be mixed with another oxide. An intermediate layer which is not illustrated can be provided between the third n-type layer 4C and the n-electrode 5. To reduce reflectivity, it is preferable that the refractive index of the third n-type layer 4C is smaller than the refractive index of the first n-type layer 4A.

It is preferable that the third n-type layer 4C is a layer that mainly contains (50 wt % or more of) a compound represented by $Ga_{z1}M4_{z2}M5_{z3}M6_{z4}M7_{z5}O_{z6}$, and the M4 is Hf or/and Zr, the M5 is one or more selected from the group consisting of In, Ti, and Zn, M6 is Al or/and B, and M7 is one or more selected from the group consisting of Sn, Si, and Ge. The z1 and the z6 are larger than 0. The z2, the z3, the z4, and z5 are 0 or more. When the sum of the z1, the z2, the z3, the z4, and the z5 is 2, it is preferable that the z6 is 3.0 or more and 3.8 or less. All configurations of an oxide having Ga as a base is mixed with another oxide, an oxide having Ga as a base is doped with another element, and an oxide having Ga doped with another element as a base is mixed with another oxide are represented by $Ga_{z1}M4_{z2}M5_{z3}M6_{z4}M7_{z5}O_{z6}$.

90 wt % or more of the third n-type layer 4C is preferably a compound represented by $Ga_{z1}M4_{z2}M5_{z3}M6_{z4}M7_{z5}O_{z6}$. 95 wt % or more of the third n-type layer 4C is more preferably a compound represented by $Ga_{z1}M4_{z2}M5_{z3}M6_{z4}M7_{z5}O_{z6}$. 98 wt % or more of the third n-type layer 4C is still more preferably a compound represented by $Ga_{z1}M4_{z2}M5_{z3}M6_{z4}M7_{z5}O_{z6}$. The third n-type layer 4C more preferably consists of a compound represented by $Ga_{z1}M4_{z2}M5_{z3}M6_{z4}M7_{z5}O_{z6}$.

The conduction band minimum of the third n-type layer 4C is adjusted by mainly by Ga, the element of M4, and the element of M6. By lowering the element ratio of the M4 and the M6 than the first n-type layer 4A, a difference from the conduction band minimum of the third n-type layer 4C and a difference from the conduction band minimum of the n-electrode 5 decrease. Thereby, the continuity of the connection of the conduction band minimum between the first n-type 4A and the n-electrode 5. $(z1+z2+z4)/(z1+z2+z3+z4+z5)$ is preferably 0.60 or more and 1.00 or less in the third n-type layer 4C. According to the same viewpoint, $(z1+z2+z4)/(z1+z2+z3+z4+z5)$ is preferably 0.80 or more and 1.00 or less, and more preferably 0.90 or more and 1.00 or less in the third n-type layer 4C.

The third n-type layer 4C is a layer having a conduction band minimum lower than the first n-type layer 4A, and the conduction band minimum of the third n-type layer 4C is between the first n-type layer 4A and the second n-type layer 4B. By using the third n-type layer 4C, the conduction band minimum is continuously connected from the p-type light-absorbing layer 3 to the n-electrode 5, FF and Voc are improved, and it contributes improving the conversion efficiency. When z2 or/and z4 are numerical values larger than 0, it is preferable that the third n-type layer 4C also has the elements of M4 or/and M6 that are common to the first n-type layer 4A. That is, if the first n-type layer 4A contains Hf, Zr, Al or/and B, it is preferable that the third n-type layer 4C contains Hf, Zr, Al or/and B rather than does not contain Hf, Zr, Al or/and B. When z1 is larger than x1 and $(z2+z4)$ is smaller than $(x20+x21+x25+x26)$, the conduction band minimum of the third n-type layer 4C becomes lower than the conduction band minimum of the first n-type layer 4A, and the continuity of the connection of the conduction band is improved. According to the same viewpoint, $(z2+z4)/(z1+z2+z4)$ is preferably 0.00 or more and 0.30 or less, and more preferably 0.00 or more and 0.20 or less. Further, when $(x20+x21+x25+x26)$ and $(z2+z4)$ are close to each other, improving of the continuity of the connection of the conduction band minimum is small by providing the third n-type layer 4C. Therefore, $(z2+z4)$ is preferably 90% or less of $(x20+x21+x25+x26)$, $(z2+z4)$ is more preferably 80% or less of $(x20+x21+x25+x26)$ or less, and $(z2+z4)$ is more preferably 70% or less of $(x20+x21+x25+x26)$.

The z3 and z5 are preferable (x22+x23+x24) and (x27+x28+x29) of the first embodiment, respectively. Therefore, z3/(z1+z2+z3+z4+z5) is preferably 0.00 or more and 0.20 or less, more preferably 0.00 or more and 0.10 or less, and more preferably 0.00 or more and 0.05 or less. z5/(z1+z2+z3+z4+z5) is preferably 0.00 or more and 0.20 or less, and more preferably 0.00 or more and 0.10 or less.

The sum of a film thickness of the first n-type layer 4A, a film thickness of the third n-type layer 4C, and a film thickness of the second n-type layer 4B is typically 3 nm or more and 100 nm or less. When the sum of the film thickness of the first n-type layer 4A, the film thickness of the third n-type layer 4C, and the film thickness of the second n-type layer 4B is less than 3 nm, a leakage current may be generated in a case where coverage of the first n-type layer 4A, the third n-type layer 4C, and the second n-type layer 4B is poor, and characteristics may be deteriorated. When the coverage is good, the film thickness is not limited to the above film thickness. When the sum of the film thickness of the first n-type layer 4A, the film thickness of the third n-type layer 4C, and the film thickness of the second n-type layer 4B exceeds 50 nm, characteristics may be deteriorated due to an excessive increase in resistance of the n-type layer from the first n-type layer 4A to the second n-type layer 4B, or a short-circuit current may be reduced due to a decrease in transmittance. Accordingly, the sum of the film thickness of the first n-type layer 4A, the film thickness of the third n-type layer 4C, and the film thickness of the second n-type layer 4B is more preferably 3 nm or more and 30 nm or less, still more preferably 5 nm or more and 30 nm or less.

One or more selected from the group consisting of the elements of Ga, the element of M4, the element of M5, and the element of M6 may have a composition ratio changing in the third n-type layer 4C in a film thickness direction of the third n-type layer 4C. It is preferable that the element of M5 and the element of M7 are small on the p-type light-absorbing layer 3 side and is large on the n-electrode 5 side. It is preferable that the element of M6 is large on the p-type light-absorbing layer 3 side and is small on the n-electrode 5 side. It is preferable that the change of the composition is an inclined change, a stepwise change, or a combination of the inclined change and the stepwise change. The change of the composition is entirely or partially in a stacking direction of the layers of the solar cell 100. The carrier concentration, the conduction band minimum, and the refractive index can be adjusted from the p-type light-absorbing layer 3 side toward the n-electrode 5 side by changing a composition distribution of these elements, and thus, conversion efficiency can be improved.

As a modification of the second embodiment and the third embodiment, an embodiment includes a region satisfying the requirements of the third n-type layer 4C in the first n-type layer 4A of the second the region on the second n-type layer 4B side.

Fourth Embodiment

Figure 5:
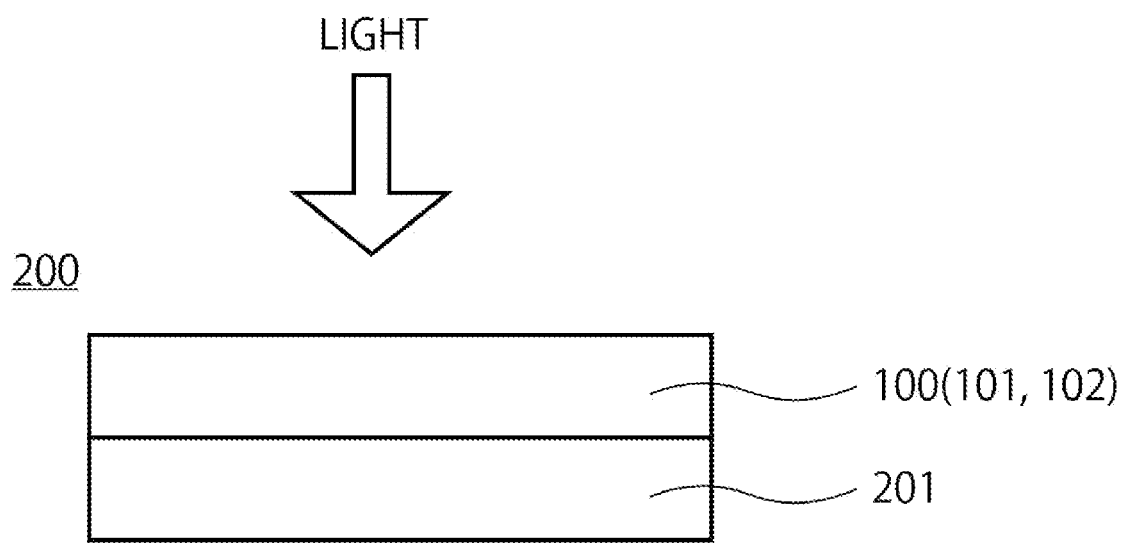
FIG. 5 is a cross-sectional view of a multi-junction solar cell according to an embodiment.

A fourth embodiment relates to a multi-junction solar cell. FIG. 5 illustrates a conceptual sectional diagram of a multi-junction solar cell 200 according to the fourth embodiment. The multi-junction solar cell 200 of FIG. 5 includes the solar cell (first solar cell) 100 of the first embodiment on the light incident side and a second solar cell 201. The band gap of the light-absorbing layer of the second solar cell 201 is smaller than the band gap of the light-absorbing layer 3 of the solar cell 100 according to the first embodiment. Incidentally, the multi-junction solar cell according to the embodiment includes a solar cell with three or more jointed solar cells. Incidentally, in the fourth embodiment, the solar cell 101-102 of the second embodiment to the second embodiment can be used instead of the solar cell 100 of the first embodiment.

The band gap of the p-type light-absorbing layer 3 of the first solar cell 100 according to the first embodiment is about 2.0 eV-2.2 eV, and thus the band gap of the light-absorbing layer of the second solar cell 200 is preferably 1.0 eV or more and 1.6 eV or less. The light-absorbing layer of the second solar cell is preferably selected from the group consisting of any one or more compound semiconductor layers among CIGS-based having a high In content, CuZnSnSSe-based, and CdTe-based, crystalline silicon, and perovskite type compound.

Fifth Embodiment

Figure 6:
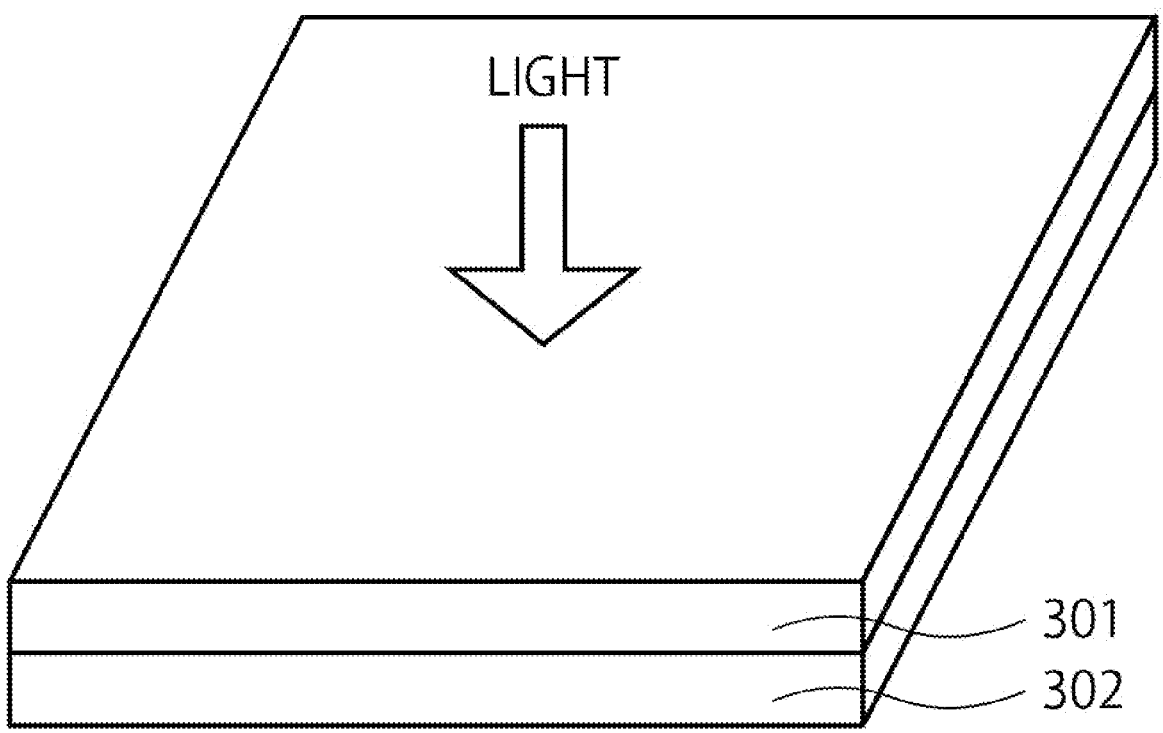
FIG. 6 is a perspective view of a solar cell module according to an embodiment.

A fifth embodiment relates to a solar cell module. FIG. 6 illustrates a perspective diagram of a solar cell module 300 according to the fifth embodiment. The solar cell module 300 in FIG. 6 is a solar cell module stacked with a first solar cell module 301 and a second solar cell module 302. The first solar cell module 301 is on the light incident side and includes the solar cell 100 according to the first embodiment. It is preferable to use the second cell 201 in the second solar cell module 302.

Figure 7:
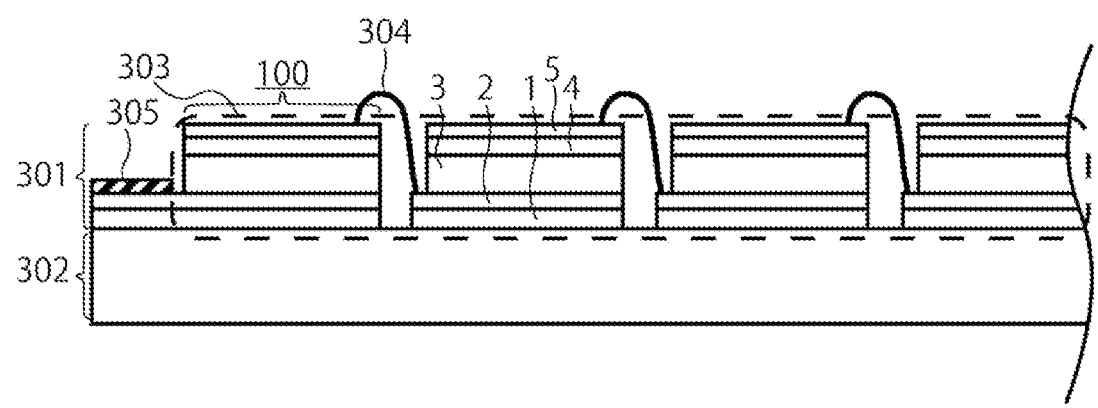
FIG. 7 is a cross-sectional view of a solar cell module according to an embodiment.

FIG. 7 illustrates a sectional diagram of the solar cell module 300. In FIG. 7, the structure of the first solar cell module 301 is illustrated in detail but the structure of the second solar cell module 302 is not illustrated. In the second solar cell module 301, the structure of the solar cell module is appropriately selected depending on the light-absorbing layer of the solar cell to be used. In the solar cell module 300 in FIG. 7, a plurality of submodules 303 with solar cells 100 which are arranged in the horizontal direction and electrically connected to each other by a wiring 304 in series and that is enclosed by a broken line are included and the plurality of submodules 303 are electrically connected to each other in parallel or in series. Adjacent submodules are electrically connected by a busbar 305.

In adjacent solar cells 100, the n-electrode 5 on the upper side and the p-electrode 2 on the lower side are connected by the wiring 304. Similar to the solar cell 100 of the first embodiment, the solar cell 100 of the fifth embodiment includes the substrate 1, p-electrode 2, the p-type light-absorbing layer 3, the n-type layer 4, and the n-electrode 5. It is preferable that both ends of the solar cell 100 in the submodule 303 are connected to the busbar 305, and the busbar 305 is configured to electrically connect a plurality of submodules 303 in parallel or in series and adjust the output voltage with the second solar cell module 302. Incidentally, the connection system of the solar cell 100 shown in the fifth embodiment is an example. The solar cell module can be configured by other connection systems.

Sixth Embodiment

Figure 8:
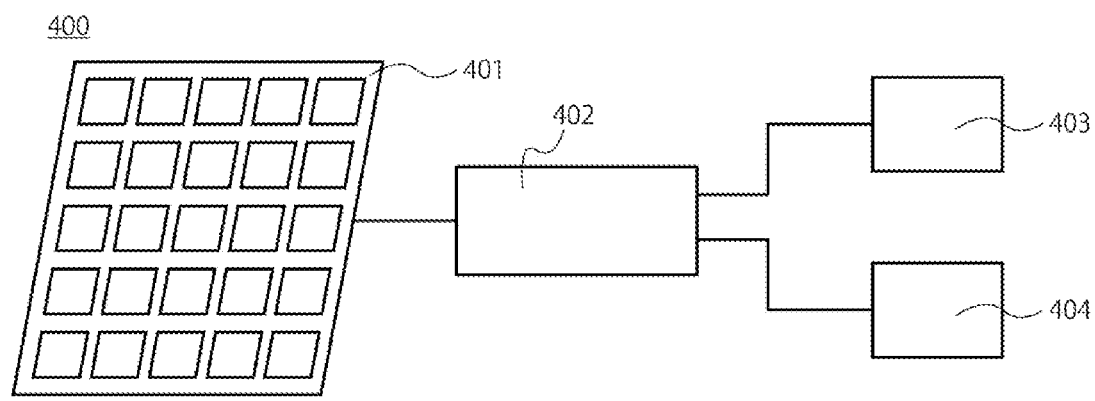
FIG. 8 is a structural view of a photovoltaic power generation system according to an embodiment.

A sixth embodiment relates to a solar photovoltaic power generation system. The solar cell module according to the fifth embodiment can be used as a generator which generates electric power in the solar photovoltaic power generation system according to the sixth embodiment. The solar photovoltaic power generation system according to the embodiment generates electric power using a solar cell module and specifically includes a solar cell module which generates electric power, a unit which converts the generated electricity into electric power, and a power storage unit which stores the generated electricity or a load which consumes the generated electricity. FIG. 8 illustrates a configuration diagram of a solar photovoltaic power generation system 400 according to the embodiment. The solar photovoltaic power generation system in FIG. 8 includes a solar cell module 401 (300), a converter 402, a storage battery 403, and a load 404. Either of the storage battery 403 or the load 404 may be omitted. The load 404 may be configured to be able to utilize the electric energy stored in the storage battery 403. The converter 402 is an apparatus including a circuit or a device which performs power conversion such as voltage transformation or DC-AC conversion such as a DC-DC converter, DC-AC-converter, AC-AC-converter and the like. As the configuration of the converter 402, a suitable configuration may be adopted depending on the configuration of the generated voltage, the storage battery 403, and the load 404.

The solar cells included in the submodule 301 which has received light and is included in the solar cell module 300 generate electric power, and the electric energy is converted by the converter 402 and stored in the storage battery 403 or consumed by the load 404. It is preferable to provide the solar cell module 401 with a sunlight tracking and driving apparatus for constantly directing the solar cell module 401 toward the sun or a light collector which collects sunlight or to add an apparatus or the like for improving the power generation efficiency.

It is preferable that the solar photovoltaic power generation system 400 is used for immovable property such as dwellings, commercial facilities, and factories or for movable property such as vehicles, aircraft, and electronic devices. The electric power generation amount is expected to increase as the solar cell having an excellent conversion efficiency according to the embodiment is used in the solar cell module.

Figure 9:
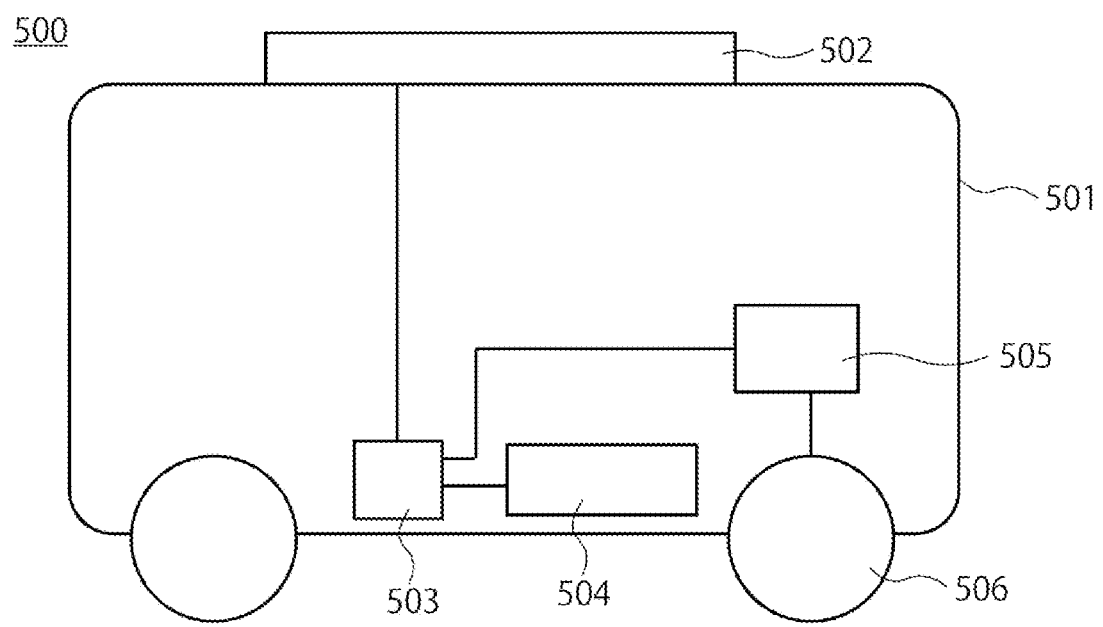
FIG. 9 is a conceptual diagram of a vehicle according to an embodiment.

A vehicle is described as an example of utilization of the solar photovoltaic power generation system 400. FIG. 9 illustrates a conceptual configuration diagram of a vehicle 500. The vehicle 500 in FIG. 9 includes a vehicle body 501, a solar cell module 502, a power converter 503, a storage battery 504, a motor 505, and tires (wheels) 506. The electric power generated by the solar cell module 501 provided on the upper portion of the vehicle body 501 is converted by the power converter 503 and is charged in the storage battery 504 or consumed by a load such as the motor 505. The vehicle 500 can be moved by rotating the tires (wheels) 506 by the motor 505 using the electric power supplied from the solar cell module 501 or the storage battery 504. The solar cell module 501 may not be a multi-junction type but may be configured only of such as the first solar cell module including the solar cell 100 according to the first embodiment. In the case of adopting a transparent solar cell module 502, it is also preferable to use the solar cell module 502 as a window for generating electric power on the side surface of the vehicle body 501 in addition to the upper portion of the vehicle body 501. Hereinafter, the present disclosure will be described more specifically based on Examples, but the present disclosure is not limited to the following Examples.

Example 1

ITO (In:Sn=90:10, film thickness 20 nm) and ATO (Sn:Sb=98:2, film thickness: 150 µm) are deposited on an upper surface of a glass substrate on a side in contact with glass as a p-electrode on a back surface side. A $Cu_2O$ light-absorbing layer is formed on a transparent p-electrode by heating at 500° C. by a sputtering method in an oxygen and argon gas atmosphere. Thereafter, by an ALD method, 10 nm of $Ga_{1.40}Al_{0.60}O_{3.00}$ having no composition inclination is deposited and 10 nm of $Ga_{0.30}Zn_{1.30}Al_{0.10}Sn_{0.30}O_{2.50}$ having no composition inclination as a n-type layer and an AZO transparent conductive film as the n-electrode are deposited on the deposited surface side. A solar cell is obtained by forming an $MgF_2$ film as an antireflection film. The obtained solar cell is evaluated for a short circuit current (Jsc), an open circuit voltage (Voc), a fill factor (FF), conversion efficiency, and transmittance. An oxygen composition ratio of the n-type layer is obtained from a type and a composition ratio of metal of a metal oxide.

The transmittance of the solar cell is evaluated. The transparency of the solar cell is an average transmittance when a wavelength of 700-1200 nm is measured with a spectrophotometer.

Examples 2 to 22 and Comparative Examples

Tables related to Examples are shown in FIG. 10 and FIG. 11. Conditions of n-type layers of Examples and Comparative Examples are shown in the tables related to Examples of FIG. 10. The same procedures as in Example 1 were carried out except for the conditions of the n-type layers. When three-layer (region) of the n-type layer is formed in Examples, a thickness of each n-type layer is 6 nm (18 nm in total). In examples 20 to 23 and comparative example 2, a composition of Al is inclinedly changed so that Al is large on the p-type light-absorbing layer side and is small on the n-electrode side. In examples 20 to 22, a target ratio of Ga and Zn is changed so that the n-type layer is a one-layer and satisfies the composition ratios shown in table. In example 19, a composition is step-wisely changed so that Al is large and Ga is small on the p-type light-absorbing layer side and Al is small and Ga is large on the n-electrode side. In examples 20 to 22, Ga decreases and Zn increases from a surface of the second n-type layer on the first n-type layer side (the second region) toward the n-electrode 5. Each of the composition of Ga and Zn changes at the same rate from a surface of the second n-type layer (the second region) on the first n-type layer side toward the n-electrode 5, Ga:Zn is 0.20:1.20 in a region from a surface of the second n-type layer (second region) on the first n-type layer side to 2.5 nm toward a film thickness, and Ga:Zn is 0.00:1.40 in a region from a surface of the second n-type layer on the n-electrode side to 2.5 nm toward the film thickness. In example 22, there is no interface and the n-type layer is formed which includes plurality of the n-type region as shown in a Table of FIG. 10.

The amount of light is adjusted to 1 sun by using a solar simulator simulating a light source of AM 1.5G and using a reference Si cell under a light source. A temperature in a measurement chamber is 25° C. under an atmospheric pressure. A voltage is swept and a current density (current divided by a cell area) is measured. When a horizontal axis represents the voltage and a vertical axis represents the current density, a point intersecting the horizontal axis represents an open circuit voltage Voc, and a point intersecting the vertical axis represents a short circuit current density Jsc. When the voltage and the current density are multiplied on a measurement curve and maximum points are Vmpp and Jmpp (maximum power point), respectively, FF=(Vmpp*Jmpp)/(Voc*Jsc), and a conversion efficiency Eff. is obtained by Eff.=Voc*Jsc*FF.

In the table of FIG. 11, the short circuit current (Jsc), the open circuit voltage (Voc), the fill factor (FF), the conversion efficiency, and the light transmittance of Examples and Comparative Examples are collectively illustrated.

The transmittance is evaluated as A when the transmittance of light in a wavelength band of 700 nm or more and 1200 nm or less is 75% or more, is evaluated as B when the transmittance of light in a wavelength band of 700 nm or more and 1200 nm or less is 70% or more and less than 75%, and is evaluated as C when the transmittance of light in a wavelength band of 700 nm or more and 1200 nm or less is less than 70%.

Jsc is evaluated as A when the conversion efficiency is 1.15 times or more the conversion efficiency of Comparative Example 1, is evaluated as B when the conversion efficiency is 0.85 times or more and less than 1.15 times Jsc of Comparative Example 1, and is evaluated as C when the conversion efficiency is less than 0.85 times Jsc of Comparative Example 1.

Voc is evaluated as A when Voc is 1.15 times or more the conversion efficiency of Comparative Example 1, is evaluated as B when Voc is 0.85 times or more and less than 1.15 times Voc of Comparative Example 1, and is evaluated as C when Voc is less than 0.85 times Voc of Comparative Example 21.

FF is evaluated as A when FF is 1.15 times or more the conversion efficiency of Comparative Example 1, is evaluated as B when FF is 1 times or more and less than 1.15 times FF of Comparative Example 1, and is evaluated as C when FF is less than 1 times FF of Comparative Example 1.

The conversion efficiency is evaluated as A when the conversion efficiency is 1.5 times or more the conversion efficiency of Comparative Example 1, is evaluated as B when the conversion efficiency is 1 times or more and less than 1.5 times the conversion efficiency of Comparative Example 1, and is evaluated as C when the conversion efficiency is less than 1 times the conversion efficiency of Comparative Example 1.

As can be seen from the table of FIG. 11, when Al, Hf, Zr or B is added to $Ga_2O_3$ as the first n-type layer, the band gap is widened, the transmittance is increased, and when Ti is added, the reflectance decreases and the transmittance increases. Although, when the bandgap becomes smaller by adding Ti to the first n-type layer, the Voc increases slightly, because the carrier concentration increases by adding Sn, Si, and Ge. When $Ga_2O_3$ added with Al is used for the first n-type layer and a compound that mainly contains Zn and Sn for the second n-type layer is used for the second n-type layer, the Voc and FF increases because the conduction band minimum of the first n-type layer 4A and the conduction band minimum of the third n-type layer, and the conduction band minimums of the second n-type layer and the conduction band minimum of the n-electrode are smoothly connected. In addition, when a material whose conduction band minimum is between the conduction band minimum of the first n-type layer and the conduction band minimum of the second n-type layer is used for the third n-type layer, Voc and FF further increases. Further, when the conduction band minimum of the first n-type layer, the conduction band minimum of the third n-type layer, the conduction band minimum of the second n-type layer, and the conduction band minimum of the n-electrode is smoothly connected with inclined composition, Voc and FF further increases. In a multi-junction solar cell using the solar cell of the example for a top cell and using a solar cell having Si as a light-absorbing layer for a bottom cell, the multi-junction solar cell also has excellent conversion efficiency owing to the high transmittance and conversion efficiency of the top cell.

In the specification, some elements are represented only by chemical symbols for elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solar cell comprising:
   a p-electrode;
   an n-electrode;
   a p-type light-absorbing layer located between the p-electrode and the n-electrode and mainly containing a cuprous oxide; and
   an n-type layer located between the p-type light-absorbing layer and the n-electrode, the n-type layer including both a first n-type layer and a second n-type layer or both a first region and a second region; wherein
   the first n-type layer or the first region are located on the p-type light-absorbing layer side,
   the second n-type layer or the second region are located on the n-electrode side,
   the first n-type layer or the first region mainly contain a compound represented by $Ga_{x1}M1_{x2}O_{x3}$, the M1 is one or more selected from the group consisting of Hf, Zr, In, Zn, Ti, Al, B, Sn, Si, and Ge, the x1, the x2, and the x3 are more than 0, a sum of the x1 and the x2 is 2, and the x3 is 3.0 or more and 3.8 or less,
   the second n-type layer or the second region mainly contain a compound represented by $Ga_{y1}Zn_{y2}M2_{y3}M3_{y4}O_{y5}$, the M2 is one or more selected from the group consisting of Hf, Zr, In, Ti, Al, B, Si, and Ge, the M3 is Sn or/and Mg, the y1, the y2, the y3, and the y4 are 0 or more, a sum of the y3 and the y4 is more than 0, a sum of the y1, the y2, the y3, and the y4 is 2, and the y5 is 2.2 or more and 3.6 or less,
   the $M1_{x2}$ is represented by $Hf_{x20}Zr_{x21}In_{x22}Zn_{x23}Ti_{x24}Al_{x25}B_{x26}Sn_{x27}Si_{x28}Ge_{x29}$, and x2=x20+x21+x22+x23+x24+x25+x26+x27+x28+x29 is satisfied,
   x20 is 0.00 or more and 0.60 or less,
   x21 is 0.00 or more and 0.60 or less,
   x22 is 0.00 or more and 0.60 or less,
   x23 is 0.00 or more and 0.60 or less,
   x24 is 0.00 or more and 0.60 or less,
   x25 is 0.00 or more and 0.60 or less,
   x26 is 0.00 or more and 0.60 or less,
   x27 is 0.00 or more and 0.60 or less,
   x28 is 0.00 or more and 0.60 or less,
   x29 is 0.00 or more and 0.60 or less, and
   (x20+x21+x25+x26)/(x20+x21+x22+x23+x24+x25+x26+x27+x28+x29) is 0.70 or more and 1.00 or less.

2. The solar cell according to claim 1,
   wherein (y1+y2)/(y1+y2+y3+y4) is 0.60 or more and 0.98 or less, and (y3+y4)/(y1+y2+y3+y4) is 0.02 or more and 0.40 or less.

3. The solar cell according to claim 1,
   wherein (y1+y2)/(y1+y2+y3+y4) is 0.65 or more and 0.95 or less, and (y3+y4)/(y1+y2+y3+y4) is 0.05 or more and 0.35 or less.

4. The solar cell according to claim 1,
wherein when Zn or/and Sn is contained in the first n-type layer or the first region, the composition ratio of the Zn and Sn is lower than the concentrations of Zn and Sn in the second n-type layer or the second region, respectively.

5. The solar cell according to claim 1,
wherein the element M2 is included in the first n-type layer or the first region or/and the n-electrode.

6. The solar cell according to claim 1,
wherein when the second n-type layer or the second region contains Zn, the e-electrode is a transparent conductive oxide film containing Zn.

7. The solar cell according to claim 1,
wherein the y3 is smaller than x2.

8. The solar cell according to claim 1,
wherein the M2y3 is represented by $Hf_{y30}Zr_{y31}In_{y32}Ti_{y33}Al_{y34}B_{y35}Si_{y36}Ge_{y37}$, and $y3=y30+y31+y32+y33+y34+y35+y36+y37$ is satisfied,
the y30 is 0.00 or more and 0.40 or less,
the y31 is 0.00 or more and 0.40 or less,
the y32 is 0.00 or more and 0.40 or less,
the y33 is 0.00 or more and 0.40 or less,
the y34 is 0.00 or more and 0.40 or less,
the y35 is 0.00 or more and 0.40 or less,
the y36 is 0.00 or more and 0.40 or less,
the y37 is 0.00 or more and 0.40 or less, and
$(y30+y31+y34+y35)/(y30+y31+y32+y33+y34+y35+y36+y37)$ is 0.70 or more and 1.00 or less.

9. The solar cell according to claim 1,
wherein $y4/(y1+y2+y3+y4)$ is 0.10 or more and 0.50 or less.

10. The solar cell according to claim 1,
wherein one or more elements selected from the group consisting of In, Ti, Zn, Sn, Si, and Ge in the second n-type layer or the second region is small on the p-type light-absorbing layer side and is large on the n-electrode side, and
one or more elements selected from the group consisting of Al, B, Hf, and Zr in the second n-type layer or the second region is large on the p-type light-absorbing layer side and small on the n-electrode side.

11. The solar cell according to claim 1,
wherein $x2/(x1+x2)$ is 0.10 or more and 0.60 or less.

12. The solar cell according to claim 1,
wherein the M1 x2 is represented by $Hf_{x20}Zr_{x21}In_{x22}Zn_{x23}Ti_{x24}Al_{x25}B_{x26}Sn_{x27}Si_{x28}Ge_{x29}$,
$x2=x20+x21+x22+x23+x24+x25+x26+x27+x28+x29$ is satisfied,
x20 is 0.00 or more and 0.60 or less,
x21 is 0.00 or more and 0.60 or less,
x22 is 0.00 or more and 0.60 or less,
x23 is 0.00 or more and 0.60 or less,
x24 is 0.00 or more and 0.60 or less,
x25 is 0.00 or more and 0.60 or less,
x26 is 0.00 or more and 0.60 or less,
x27 is 0.00 or more and 0.60 or less,
x28 is 0.00 or more and 0.60 or less,
x29 is 0.00 or more and 0.60 or less, and
$(x20+x21+x25+x26)/(x20+x21+x22+x23+x24+x25+x26+x27+x28+x29)$ is 0.80 or more and 1.00 or less.

13. The solar cell according to claim 1,
wherein one or more elements selected from the group consisting of Ga and the element of M1 have a composition ratio changing in the first n-type layer or the first region in a film thickness direction.

14. The solar cell according to claim 1,
wherein one or more elements selected from the group consisting of In, Ti, Zn, Sn, Si, and Ge in the first n-type layer or the first region is small on the p-type light-absorbing layer side and is large on the n-electrode side, and
one or more elements selected from the group consisting of Al, B, Hf, and Zr in the first n-type layer or the first layer is large on the p-type light-absorbing layer and is small on the n-electrode side.

15. The solar cell according to claim 1,
wherein a third n-type layer or a third n-type region is included between the first n-type layer or the first region and the second n-type layer or the second region, and
the third n-type region or the third n-type region is represented by $Ga_{z1}M4_{z2}M5_{z3}M6_{z4}M7_{z5}O_{z6}$, the M4 is Hf or/and Zr, the M5 is one or more selected from the group consisting of In, Ti, and Zn, the M6 is Al or/and B, the M7 is one or more selected from the group consisting of Sn, Si, and Ge, the z1 and z6 are more than 0, the z2, the z3, the z4, and the z5 are 0 or more, and the z6 when a sum of the z1, z2, z3, z4, and z5 is 2 is 3.0 or more and 3.8 or less.

16. A multi-junction solar cell comprising:
the solar cell according to claim 1; and
a solar cell including a light-absorbing layer in which a band gap is smaller than a band gap of the p-type light-absorbing layer of the solar cell according to claim 1.

17. A solar cell module using the solar cell according to claim 1.

18. A photovoltaic power generation system that performs photovoltaic power generation by using the solar cell module according to claim 17.

19. A solar cell comprising:
a p-electrode;
an n-electrode;
a p-type light-absorbing layer located between the p-electrode and the n-electrode and mainly containing a cuprous oxide; and
an n-type layer located between the p-type light-absorbing layer and the n-electrode, the n-type layer including both a first n-type layer and a second n-type layer or both a first region and a second region; wherein
the first n-type layer or the first region are located on the p-type light-absorbing layer side,
the second n-type layer or the second region are located on the n-electrode side,
the first n-type layer or the first region mainly contain a compound represented by $Ga_{x1}M1_{x2}O_{x3}$, the M1 is one or more selected from the group consisting of Hf, Zr, In, Zn, Ti, Al, B, Sn, Si, and Ge, the x1, the x2, and the x3 are more than 0, a sum of the x1 and the x2 is 2, and the x3 is 3.0 or more and 3.8 or less,
the second n-type layer or the second region mainly contain a compound represented by $Ga_{y1}Zn_{y2}M2_{y3}M3_{y4}O_{y5}$, the M2 is one or more selected from the group consisting of Hf, Zr, In, Ti, Al, B, Si, and Ge, the M3 is Sn or/and Mg, the y1, the y2, the y3, and the y4 are 0 or more, a sum of the y3 and the y4 is more than 0, a sum of the y1, the y2, the y3, and the y4 is 2, and the y5 is 2.2 or more and 3.6 or less, the M1 x2 is represented by $Hf_{x20}Zr_{x21}In_{x22}Zn_{x23}Ti_{x24}Al_{x25}B_{x26}Sn_{x27}Si_{x28}Ge_{x29}$, $x2=x20+x21+x22+x23+x24+x25+x26+x27+x28+x29$ is satisfied,
x20 is 0.00 or more and 0.60 or less, x21 is 0.00 or more and 0.60 or less,
x22 is 0.00 or more and 0.60 or less,
x23 is 0.00 or more and 0.60 or less,
x24 is 0.00 or more and 0.60 or less,
x25 is 0.00 or more and 0.60 or less,
x26 is 0.00 or more and 0.60 or less,
x27 is 0.00 or more and 0.60 or less,
x28 is 0.00 or more and 0.60 or less,
x29 is 0.00 or more and 0.60 or less, and
(x20+x21+x25+x26)/(x20+x21+x22+x23+x24+x25+x26+x27+x28+x29) is 0.80 or more and 1.00 or less.

20. A solar cell comprising:
a p-electrode;
an n-electrode;
a p-type light-absorbing layer located between the p-electrode and the n-electrode and mainly containing a cuprous oxide; and
an n-type layer located between the p-type light-absorbing layer and the n-electrode, the n-type layer including both a first n-type layer and a second n-type layer or both a first region and a second region; wherein
the first n-type layer or first region are located on the p-type light-absorbing layer side,
the second n-type layer or the second region are located on the n-electrode side,
the first n-type layer or the first region mainly contain a compound represented by $Ga_{x1}M1x20x3$, the M1 is one or more selected from the group consisting of Hf, Zr, In, Zn, Ti, Al, B, Sn, Si, and Ge, the x1, the x2, and the x3 are more than 0, a sum of the x1 and the x2 is 2, and the x3 is 3.0 or more and 3.8 or less,
the second n-type layer or the second region mainly contain a compound represented by $Ga_{y1}Zn_{y2}M2_{y3}M3y4Oy5$, the M2 is one or more selected from the group consisting of Hf, Zr, In, Ti, Al, B, Si, and Ge, the M3 is Sn or/and Mg, the y1, the y2, the y3, and the y4 are 0 or more, a sum of the y3 and the y4 is more than 0, a sum of the y1, the y2, the y3, and the y4 is 2, and the y5 is 2.2 or more and 3.6 or less,
one or more elements selected from the group consisting of In, Ti, Zn, Sn, Si, and Ge in the first n-type layer or the first region is small on the p-type light-absorbing layer side and is large on the n-electrode side, and
one or more elements selected from the group consisting of Al, B, Hf, and Zr in the first n-type layer or the first layer is large on the p-type light-absorbing layer and is small on the n-electrode side.

* * * * *